United States Patent
Direcks et al.

(10) Patent No.: US 11,143,968 B2
(45) Date of Patent: Oct. 12, 2021

(54) FLUID HANDLING STRUCTURE, LITHOGRAPHIC APPARATUS AND DEVICE MANUFACTURING METHOD

(71) Applicant: ASML NETHERLANDS B.V., Veldhoven (NL)

(72) Inventors: Daniel Jozef Maria Direcks, Simpelveld (NL); Sjoerd Nicolaas Lambertus Donders, Vught (NL); Nicolaas Rudolf Kemper, Eindhoven (NL); Danny Maria Hubertus Philips, Son en Breugel (NL); Michel Riepen, Veldhoven (NL); Clemens Johannes Gerardus Van Den Dungen, Eindhoven (NL); Adrianes Johannes Baeten, Eindhoven (NL); Fabrizio Evangelista, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 7 days.

(21) Appl. No.: 15/196,120

(22) Filed: Jun. 29, 2016

(65) Prior Publication Data
US 2016/0306283 A1 Oct. 20, 2016

Related U.S. Application Data

(63) Continuation of application No. 12/506,565, filed on Jul. 21, 2009, now Pat. No. 9,383,654.
(Continued)

(51) Int. Cl.
*G03F 7/20* (2006.01)

(52) U.S. Cl.
CPC ...... *G03F 7/70341* (2013.01); *G03F 7/70991* (2013.01)

(58) Field of Classification Search
CPC ............ G03F 7/70341; G03F 7/70716; G03F 7/2041; G03F 7/70325; G03F 7/70991
See application file for complete search history.

(56) References Cited

U.S. PATENT DOCUMENTS

| 4,509,852 A | 4/1985 | Tabarelli et al. |
| 6,867,844 B2 | 3/2005 | Vogel et al. |
(Continued)

FOREIGN PATENT DOCUMENTS

| EP | 1 420 300 | 5/2004 |
| JP | 2005-012228 | 1/2005 |
(Continued)

OTHER PUBLICATIONS

T. Podgorski et al., "Corners, Cusps, and Pearls in Running Drops", Phys. Rev. Lett., vol. 87, No. 3, Jul. 16, 2001, pp. 036102-1-036102-4.

(Continued)

*Primary Examiner* — Mesfin T Asfaw
(74) *Attorney, Agent, or Firm* — Pillsbury Winthrop Shaw Pittman, LLP

(57) ABSTRACT

A fluid handling structure for a lithographic apparatus is disclosed. The fluid handling structure has a plurality of openings arranged in plan, in a line. The fluid handling structure is configured such that the openings are directed, in use, towards a facing surface, the facing surface being a substrate and/or a substrate table. The substrate table is configured to support the substrate. Outward of the line of openings is a damper. The damper may have a width that varies along the line of openings. The damper width is defined between the line of openings and an opposing damper edge.

20 Claims, 13 Drawing Sheets

Related U.S. Application Data

(60) Provisional application No. 61/168,404, filed on Apr. 10, 2009, provisional application No. 61/129,872, filed on Jul. 25, 2008.

(56) References Cited

U.S. PATENT DOCUMENTS

| | | |
|---|---|---|
| 7,268,854 B2 | 9/2007 | Nagasaka |
| 8,023,101 B2 | 9/2011 | Leenders et al. |
| 8,351,018 B2 | 1/2013 | Direcks et al. |
| 8,421,993 B2 | 4/2013 | Direcks et al. |
| 8,436,984 B2 | 5/2013 | Van Weert et al. |
| 2004/0136494 A1 | 7/2004 | Lof et al. |
| 2004/0207824 A1 | 10/2004 | Lof et al. |
| 2004/0263809 A1* | 12/2004 | Nakano ............... G03F 7/70341 355/30 |
| 2005/0073670 A1 | 4/2005 | Carroll |
| 2005/0213066 A1 | 9/2005 | Sumiyoshi |
| 2005/0217137 A1* | 10/2005 | Smith ............... H01L 21/67017 34/407 |
| 2006/0023183 A1 | 2/2006 | Novak et al. |
| 2006/0087630 A1 | 4/2006 | Kemper et al. |
| 2006/0119809 A1 | 6/2006 | Verhagen et al. |
| 2006/0158627 A1 | 7/2006 | Kemper et al. |
| 2006/0250593 A1* | 11/2006 | Nishii ............... G03F 7/70341 355/53 |
| 2006/0290909 A1 | 12/2006 | Donders et al. |
| 2007/0146663 A1* | 6/2007 | Nagasaka ............. G03F 7/2041 355/53 |
| 2008/0018866 A1 | 1/2008 | Nagasaka et al. |
| 2008/0032234 A1* | 2/2008 | Mizutani ................. G03F 7/709 430/311 |
| 2008/0192214 A1 | 8/2008 | Leenders et al. |
| 2008/0212046 A1 | 9/2008 | Riepen et al. |

FOREIGN PATENT DOCUMENTS

| | | |
|---|---|---|
| JP | 2005-109426 | 4/2005 |
| JP | 2006-196905 | 7/2006 |
| JP | 2007-013152 | 1/2007 |
| JP | 2008-147652 | 6/2008 |
| WO | 2005/064405 | 7/2005 |
| WO | 2006/101120 | 9/2006 |

OTHER PUBLICATIONS

Hoffman, R.L., "A Study of the Advancing Interface", Journal of Colloid and Interface Science, vol. 50, No. 2, Feb. 1975, pp. 228-241.

Voinov, O.V., "Hydrodynamics of Wetting", Fluid Dyn., vol. 11, (1976), pp. 714-721.

Tanner, L.H., "The spreading of silicone oil drops on horizontal surfaces", J. Phys. D: Appl. Phys., vol. 12, 1979, pp. 1473-1485.

Blake, T.D. et al., "Wetting at high capillary numbers", Journal of Colloid and Interface Science 279, (2004), pp. 198-205.

Eggers, J., "Hydrodynamic Theory of Forced Dewetting", Phys. Rev. Lett., vol. 93, No. 9, (2004), pp. 094502-1-094502-4.

Japanese Office Action dated Jul. 25, 2011 in corresponding Japanese Patent Application No. 2009-168336.

* cited by examiner

FLUID HANDLING STRUCTURE, LITHOGRAPHIC APPARATUS AND DEVICE MANUFACTURING METHOD

This application is a continuation of U.S. patent application Ser. No. 12/506,565, filed Jul. 21, 2009, now allowed, which claims priority and benefit under 35 U.S.C. § 119(e) to U.S. Provisional Patent Application No. 61/129,872, entitled "FLUID HANDLING STRUCTURE, LITHOGRAPHIC APPARATUS AND DEVICE MANUFACTURING METHOD", filed on Jul. 25, 2008 and to U.S. Provisional Patent Application No. 61/168,404, entitled "FLUID HANDLING STRUCTURE, LITHOGRAPHIC APPARATUS AND DEVICE MANUFACTURING METHOD", filed on Apr. 10, 2009. The content of each of the foregoing applications is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic and/or a fluorohydrocarbon, and an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. In an embodiment the fluid handling system may provide a barrier to fluid and thereby be a barrier member. In an embodiment the fluid handling system may create or use a flow of fluid (such as gas), for example to help in handling liquid. In an embodiment, immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. The direction of the liquid flow is represented arrows.

FIG. 4 schematically depicts an exemplary liquid supply system for use in a lithographic projection apparatus, according to an embodiment of the present invention. A liquid is supplied by two groove inlets IN on either side of the projection system PL (or PS) as indicated by the direction of the arrows and is removed by a plurality of discrete outlets OUT, arranged radially outwardly of the inlets IN, and as represented by arrows. In the embodiment of FIG. 4, inlets IN and outlets OUT are arranged within a plate having a hole through which a beam of radiation is projected. Liquid is supplied by one groove inlet IN on one side of the projection system PL and is removed by a plurality of discrete outlets OUT on the other side of the projection system PL, thereby causing a flow of a thin film of liquid between the projection system PL and the projection system PL. The choice of a combination of inlet IN and outlets OUT incorporated within the liquid supply system can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system may improve temperature control and processing of the substrate, evaporation of the immersion liquid can still occur. One way of alleviating that problem is described in United States patent application publication no. US 2006/119809 in which a member is provided which covers the substrate W in all positions and which is arranged to have immersion liquid extending between it and the top surface of the substrate and/or substrate table which holds the substrate.

It is desirable to be able to move the substrate as fast as possible below the projection system. For this, the liquid confinement system or fluid handling system, especially for a localized area fluid handling system, should be designed to allow a high rate of scanning motion without significant liquid loss or formation of bubbles. It is desirable that a high rate of scanning motion can be achieved on standard substrate exposure coatings such as a topcoat and resist. It is desirable that stepping and scanning motions can be performed at a close or similar speed, if not substantially the same speed.

SUMMARY

It is desirable, for example, to provide a fluid handling system which maintains liquid in a space between the final element of the projection system and the substrate.

According to an aspect of the invention, there is provided a fluid handling structure for a lithographic apparatus. The fluid handling structure has a plurality of openings arranged in plan, in a line. The fluid handling structure is configured such that the openings are directed, in use, towards a facing surface. The facing surface is the surface of a substrate and/or a substrate table. The substrate table is configured to support the substrate. Outward of the line of openings is a damper. The damper has a width that varies along the line of openings. The width is defined between the line of openings and an opposing damper edge.

According to an aspect of the invention, there is provided a lithographic apparatus comprising the fluid handling structure according to the previously mentioned aspect of the invention.

According to an aspect of the invention, there is provided a fluid handling structure for a lithographic apparatus. The fluid handling structure has a plurality of openings arranged in plan, in a line. The fluid handling structure is configured such that the openings are formed in an undersurface of the fluid handling structure and are directed, in use, towards a facing surface. The facing surface is the surface of a substrate and/or a substrate table. The substrate table is configured to support the substrate. Outward of the line is a damper. The damper has a surface that is angled relative to the undersurface.

According to an aspect of the invention, there is provided a device manufacturing method, comprising: providing a fluid and retrieving a liquid. In providing a fluid, fluid is provided to a surface of a substrate and/or substrate table. The substrate table supports the substrate. In retrieving liquid, liquid is retrieved from the surface of the substrate and/or the substrate table by applying an under pressure to a plurality of openings in a fluid handling structure. The openings are arranged, in plan, in a line and are directed towards a substrate and/or a substrate table. In retrieving, a contact line of the liquid is supported by a damper. The damper is outward of the line of openings and has a width that varies along the line of openings. The width is defined between the line of openings and an opposing damper edge.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
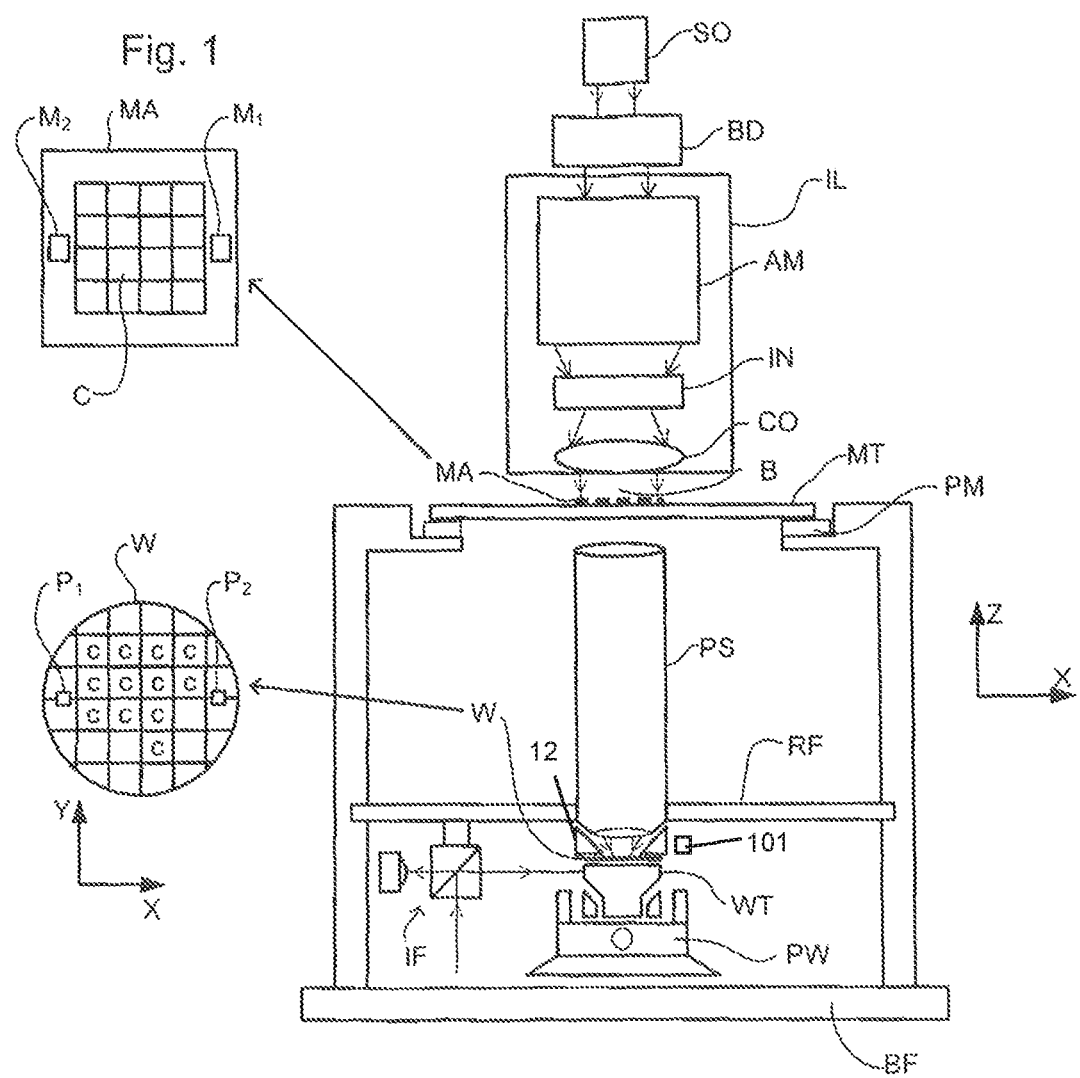
FIG. 1 depicts a lithographic apparatus according to an embodiment of the invention.
Figure 2:
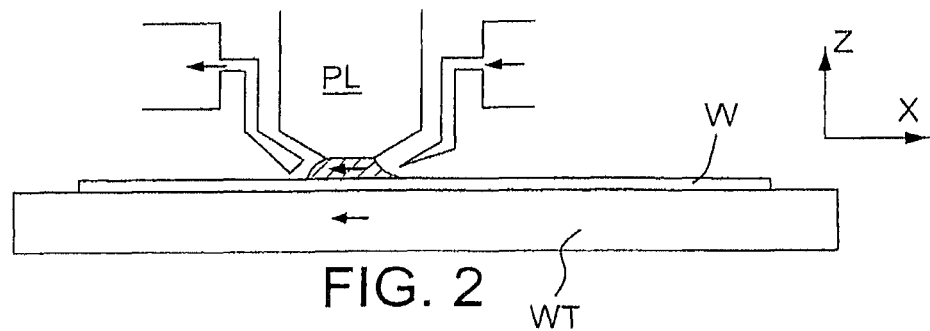
FIGS. 2 and 3 depict a liquid supply system for use in a lithographic projection apparatus.
Figure 3:
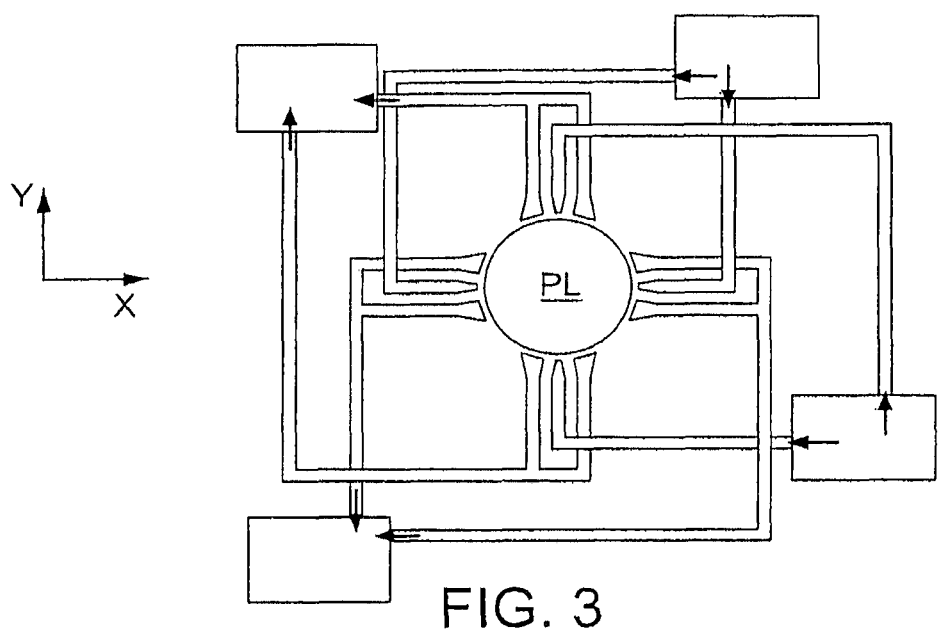
Figure 4:
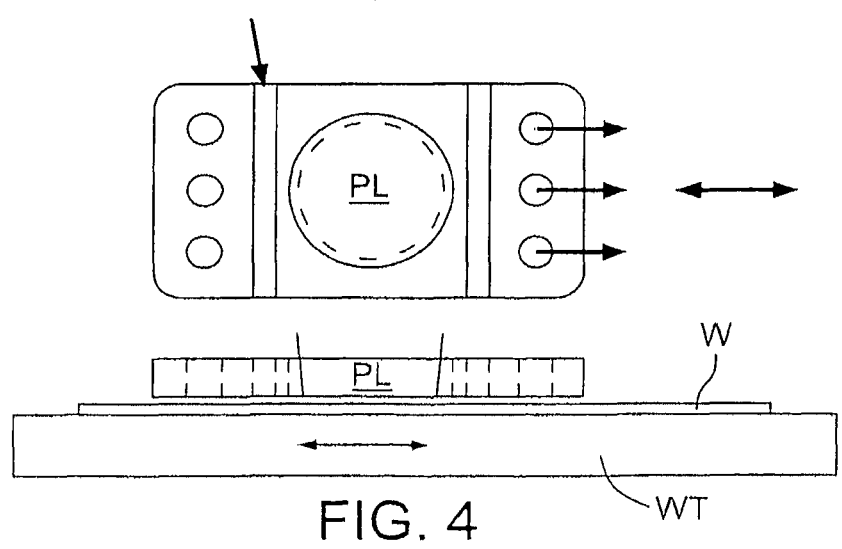
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which substantially the whole of the substrate W and optionally part of the substrate table WT is submersed in a bath of liquid and the so called localized immersion system which use liquid supply systems in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 can also be used in such a system. However, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a barrier member which extends along at least a part of a boundary of the space between the final element of the projection system and the substrate table. Such an arrangement is illustrated in FIG. 5.

Figure 5:
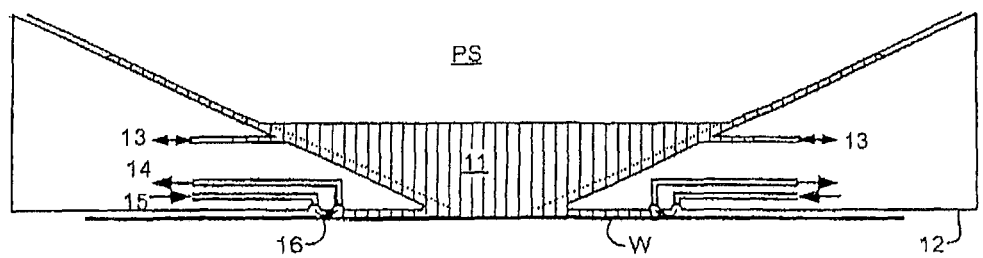
FIG. 5 depicts a further liquid supply system for use in a lithographic projection apparatus.

FIG. 5 schematically depicts a localized liquid supply system or fluid handling structure with a barrier member 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a gas seal or fluid seal. The contactless seal may be achieved by capillary forces and thus might be without a gas seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824. In an embodiment, the inlet 14 is absent. Outlet 15 is a liquid extractor. The extractor may be a single phase extractor. The outlet may have a porous member which may cover the outlet. The porous member may have a liquidphilic (e.g. hydrophilic) surface and have pores which have a diameter range of 5 to 200 µm, desirably 5 to 50 µm. Such an arrangement is described in United States patent application publication number US 2006-0087630 A1 which is hereby incorporated by reference in its entirety.

An embodiment of the present invention relates to a particular type of extractor for use in a fluid handling structure which aims to prevent the meniscus from advancing beyond a certain point. That is, an embodiment of the invention relates to a meniscus pinning device which pins the edge of liquid in a space between the final element of the projection system and the substrate and/or substrate table substantially in place. The meniscus pinning arrangement relies on a so-called gas drag extractor principle which has been described, for example, in U.S. patent application Ser. No. 11/987,569, filed Nov. 30, 2007. In that system, extraction openings are placed in a cornered shape. The corners are aligned with the stepping and scanning directions. This reduces the force on the meniscus between two outlets for a given speed in the step or scan direction compared to if the two outlets were aligned perpendicular to the direction of step or scan. In an embodiment, each extraction opening, or a conduit connected to the extraction opening, has a porous member as described above.

In an embodiment, the geometry of the cornered shape in which the openings are arranged allows sharp corners (between about 60° and 90°, desirably between 75° and 90° and most desirably between 75° and 85°) to be present for the corners aligned both in the scan and in the step directions. This allows increased speed in the direction of each aligned corner. This is because the creation of liquid droplets due to an unstable meniscus in the scanning or stepping direction is reduced. Where corners are aligned with both the scanning and stepping directions, increased speed may be achieved in those directions. Desirably the speed of movement in the scanning and stepping directions may be substantially equal.

Figure 6:
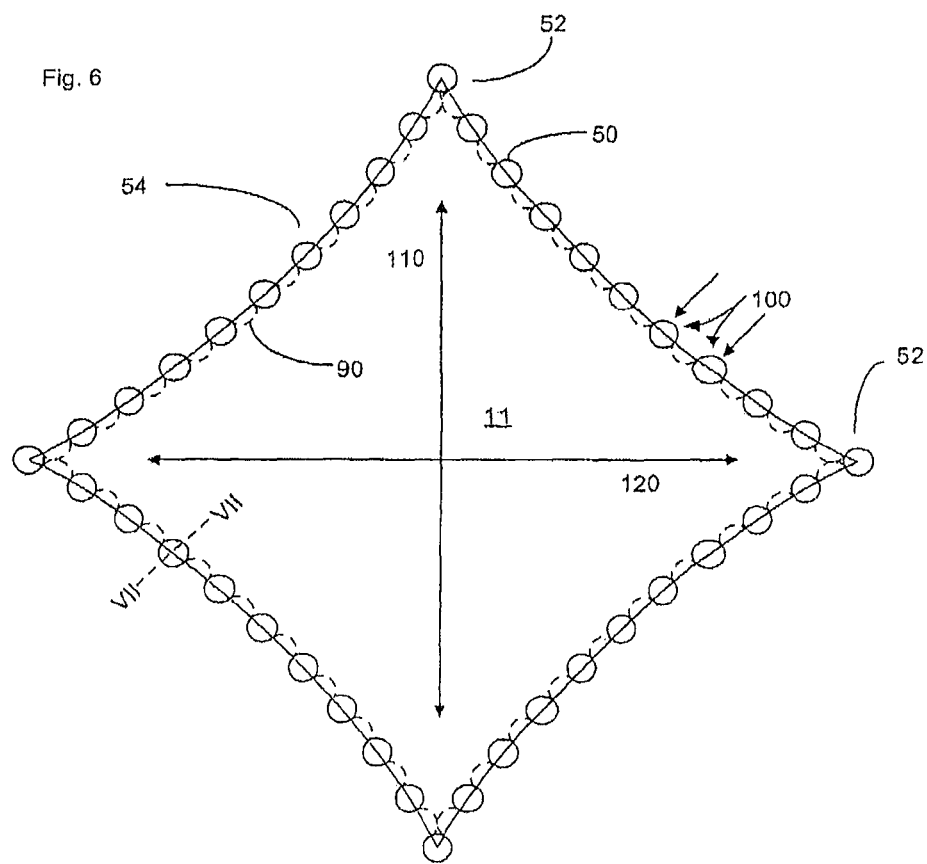
FIG. 6 is a schematic illustration, in plan, of a meniscus pinning system for use in a lithographic apparatus.

FIG. 6 illustrates schematically and in plan the meniscus pinning feature of a fluid handling structure or system. The features of a meniscus pinning device are illustrated which may, for example, replace or augment the meniscus pinning arrangement 14, 15, 16 of FIG. 5. The meniscus pinning device of FIG. 6 comprises a plurality of discrete openings 50. Each of these openings 50 are illustrated as being circular though this is not necessarily the case. Indeed one or more of the openings 50 may be one or more shapes selected from the following shapes: square, rectangular, oblong, triangular, elongate slit, etc. Each opening has, in plan, a length dimension (i.e. in the direction from one opening to the adjacent opening) of greater than 0.2 mm, desirably greater than 0.5 mm or 1 mm, in one embodiment between 0.1 mm and 10 mm, in one embodiment between 0.25 and 2 mm. In one embodiment the length dimension of each opening is between 0.1 mm and 2 mm. In another embodiment the length dimension of each opening is between 0.25 mm and 1 mm.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the fluid handling structure or system (or confinement structure, barrier member or liquid supply system) may be increased in pressure to generate the desired pressure difference.

In the fluid handling structure or system of FIG. 6 the openings are fluid extraction openings. That is they are inlets for the passage of gas and/or liquid into the fluid handling structure. That is, the inlets may be considered as outlets from the space 11. This will be described in more detail below. However, as will become apparent when describing other Figures the openings may equally be outlets for the passage of fluid (e.g., liquid) out of the fluid handling structure 12. That is, the openings are inlets into the space 11.

The openings 50 are formed in a surface of a fluid handling structure. That surface faces the substrate and/or substrate table, in use. In one embodiment the openings are in a flat surface of the fluid handling structure. In an embodiment, a ridge may be present on the bottom surface of the substrate member. In that embodiment the openings may be in the ridge. In an embodiment, the openings 50 may be defined by needles. The bodies of some of the needles, e.g., adjacent needles, may be joined together. The needles may be joined together to form a single body. The single body may form the corner shape.

Figure 7:
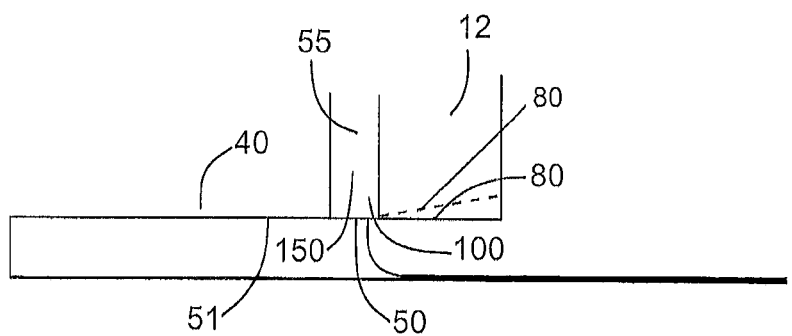
FIG. 7 depicts, in cross-section in a plane substantially parallel to the optical axis of the projection system, the meniscus pinning system shown in FIG. 6.

As can be seen from FIG. 7, the openings 50 are the end of a tube or elongate passageway 55, for example. Desirably the openings are positioned such that they face the substrate W in use. The rims (i.e. the edge of outlets defined in a surface) of the openings 50 are substantially parallel to a top surface of the substrate W. The openings are directed, in use, towards the substrate and/or substrate table configured to support the substrate. Another way of thinking of this is that an elongate axis of the passageway 55 to which the opening 50 is connected is substantially perpendicular (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the opening 50 to the liquid. This creates a gas flow as illustrated by arrows 100 and this gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space to which the fluid handling structure supplies liquid. That is, the openings 50 are substantially continuously spaced around the space (although, as will be described below, the spacing between adjacent openings 50 may vary). This differs from U.S. patent application Ser. No. 11/798,928, filed on May 17, 2007, in which extraction openings are in four separate cornered lines rather than a cornered shape (there are no openings along part of the edges between corners). This is because in U.S. patent application Ser. No. 11/798,928 liquid is forced substantially tangentially towards the corners where it is extracted by gas knives. In an embodiment of the present invention liquid is extracted all the way around the cornered shape and is extracted substantially at the point at which it impinges on the cornered shape. This is achieved because the openings 50 are formed all the way around the space (in the cornered shape).

As can be seen from FIG. 6, the openings 50 are positioned so as to form, in plan, a cornered shape, i.e. a shape with corners 52. In an embodiment the shape is a square with curved edges or sides 54 as described in U.S. patent application No. 61/071,621, filed on 8 May 2008, which is hereby incorporated in its entirety by reference. The edges 54 have a negative radius. The edges curve towards the center of the cornered shape in areas away from the corners 52. In another embodiment, the edges may be straight or have a positive radius of curvature, which is desirably large (that is the radius of curvature is large, so there is little variation from a straight edge).

The cornered shape, which may be a square, has principal axes 110, 120 aligned with the major directions of travel of the substrate W under the projection system. This helps ensure that the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

Therefore the use of a square shape allows movement in the step and scanning directions to be at a substantially equal maximum speed. If movement in one of the directions, for example the scan direction is desired to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example between about 90° and 120°, in an embodiment between 90° and 105°, or in an embodiment between 85° and 105°).

Thus, throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two openings which are aligned perpendicularly to the direction of travel so that the meniscus between those two openings receives the maximum available force by movement of the substrate W.

In an embodiment, each of the openings 50 is, in plan, spaced apart from each other between 0.25 and 10 times their maximum plan dimension. In one embodiment the spacing between openings 50 is between 0.1 mm and 15 mm. In another embodiment the spacing between openings is between 1 mm and 5 mm.

FIG. 7 illustrates that the opening 50 is provided in a surface 51 of the bottom 40 of the fluid handling structure. This is however not necessarily the case and the opening 50 may be in a protrusion from the bottom surface of the fluid handling structure. Arrow 100 shows the flow of gas from outside of the fluid handling structure into the passageway 55 associated with the opening 50 and the arrow 150 illustrates the passage of liquid from the space into the opening 50. The passageway 55 and opening 50 are desirably designed so that two phase extraction (i.e. gas and liquid) desirably occurs in an annular flow mode in which gas substantially flows through the center of the passageway 55 and liquid substantially flows along the walls of the passageway 55. This results in smooth flow with low generation of pulsations.

There may be no meniscus pinning features radially inwardly of the openings 50. There may be no other components or meniscus pinning features radially outwardly of the openings 50. Thus, in comparison to the liquid confinement system of FIG. 5, there may be no gas inlet 15 or equivalent and the outlet 14 has been split into several discrete openings 50 each connected to, e.g., an under pressure source. The meniscus is pinned between the openings 50 with drag forces induced by gas flow into the openings 50. A gas drag velocity of greater than about 15 m/s, desirably 20 m/s, is sufficient. By avoiding the need for a gas knife, the amount of evaporation of liquid from the substrate may be reduced thereby reducing both splashing of liquid as well as thermal expansion/contraction effects. However, an embodiment of the present invention is not limited to the structure illustrated and further meniscus pinning features could be present radially inwardly and/or radially outwardly of the openings 50.

At least thirty-six (36) discrete openings 50 each with a diameter of 1 mm and separated by 3.9 mm may be effective to pin a meniscus. In another embodiment, one hundred and twelve (112) openings 50 are present. The openings 50 may be square, with a length of a side of 0.5 mm. The total gas flow in such a system is of the order of 100 l/min. In an embodiment the total gas flow is between 70 and 130 l/min.

Other geometries of the bottom of the fluid handling structure are possible. For example, any of the structures disclosed in United States patent application publication no. US 2004-0207824 could be used in an embodiment of the present invention.

An embodiment of the present invention is directed to move the substrate as fast as possible below the projection system. Thus the critical speed (which is the maximum speed at which the substrate can be scanned without losing fluid, e.g., liquid, from the contactless seal) is improved, enabling the throughput (amount of substrates per time unit) to be increased. The liquid confinement system or fluid handling system, especially for a localized area fluid handling system, is designed to allow a high rate of scanning motion increasing the stability of the immersion liquid meniscus (or contact line) without significant liquid loss or formation of bubbles. Stepping and scanning motions can be performed at a close or similar speed, if not substantially the same speed.

Immersion liquid loss may be in the form of a droplet and/or a film (together hereafter referred to as a droplet) for example at the receding side of the meniscus. It is desirable to minimize substantially droplet formation as a droplet may cause problems affecting the production yield. A bubble can be entrapped into the advancing side of the liquid meniscus. A bubble may cause imaging defects.

Contact line instabilities are dominantly influenced by the surface properties as well as the local hydrodynamic flow conditions. Therefore a good understanding of contact line dynamics is desirable for the development of advanced immersion lithographic tools. An embodiment of the present invention is an application of an improved understanding of meniscus dynamics. In particular an embodiment of the invention concerns a pressure gradient radially outwardly from the extraction opening 50. The pressure gradient may apply a shear force to the meniscus and so affect the behavior of the meniscus, especially its contact line velocity. Knowledge of the effect of the pressure gradient on the contact line velocity can be used to increase the scan speed at which the meniscus is stable.

Figure 8:
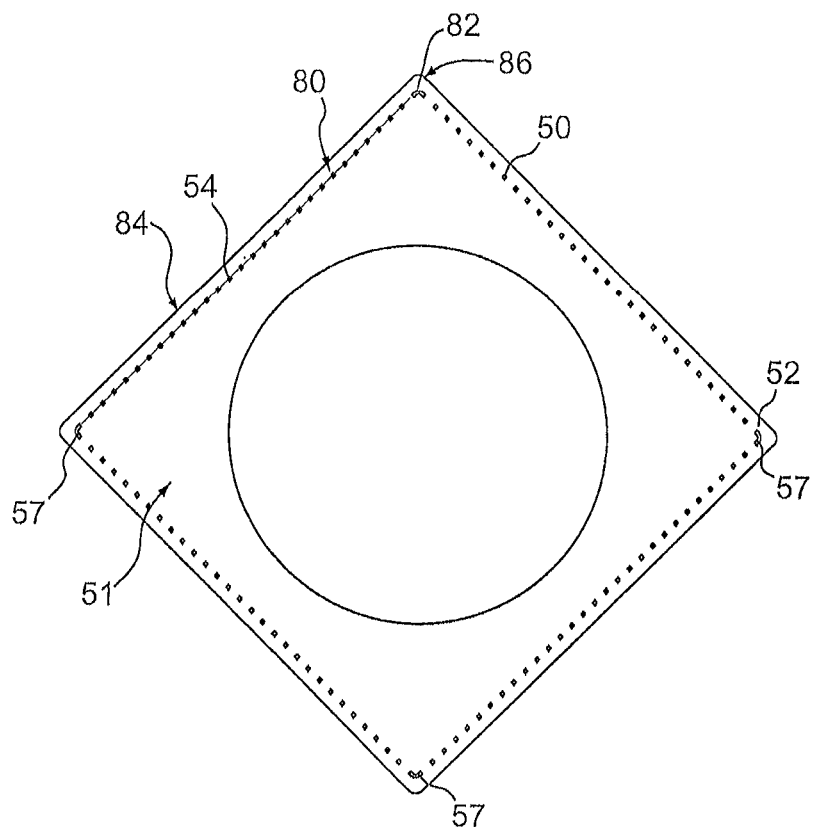
FIG. 8 illustrates, in plan, a practical embodiment of a fluid handling structure according to an embodiment of the present invention.

An embodiment of the present invention relates to a damper 80, 82 as shown in FIG. 8. The same numerals apply to FIG. 8 as to FIGS. 6 and 7. In FIG. 8, the openings 50 are provided in a cornered shape that may be similar to that of FIG. 6. For a simple representation, the edges 54 are shown to be straight, i.e. a damper of uniform width. However, in FIG. 8, a slightly different geometry may be present.

In FIG. 8, a central opening 200 is illustrated. This central opening 200 defines the space 11. In the embodiment shown in FIG. 8, the central opening is circular, in plan. However, other shapes may be used, for example a shape which is the same as the shape of the openings 50 (or in the later described embodiments, the same as the shape of the further openings 105). Other shapes may also be suitable. This may apply to all embodiments.

A damper 80, 82 is a feature radially outward of the extraction openings 50. A damper 80 is shown in FIG. 7 as the surface of the fluid handling structure 12 that, in use, faces, e.g. opposes, the substrate W, the substrate table WT or both. In fluid handling structures 12, the damper may have uniform width. In an embodiment of the present invention, the damper 80, 82 has two components: a side part 80 and a corner part 82.

A corner part 82 is located at a corner 52 of the undersurface of the fluid handling structure 12. The corner part 82 is normally associated with an opening 57 at the corner 52. The corner opening 57 may be slit. The slit may be arcuate. The corner opening may be curved, and may have a positive radius of curvature.

A side part 80 is located between two corner parts 82. The side part 80 may be associated with an edge 54. In FIG. 8 there are four corner parts 82 alternately positioned between four side parts 80.

In an embodiment of the present invention, the width of the damper 80, 82 varies around the cornered shape formed by the openings 50. The damper width is the dimension between the extractor openings 50 and the radially outward edge 84 of the damper. This may in part be because the side and edge dampers can be considered to have different functions. However, before considering the side and edge dampers 80, 82, the effect of varying damper width will now be considered.

Figures 9A, 9B:
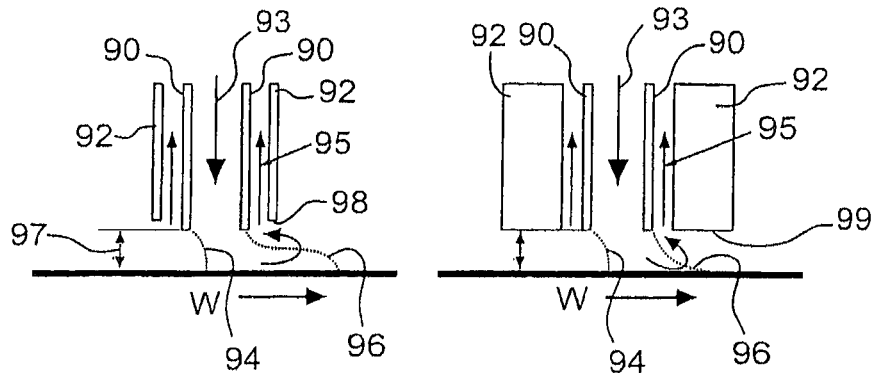
FIGS. 9a and 9b shows a sketch of a needle geometry and a cylinder geometry of a concentric needle system respectively in which immersion liquid is supplied via an inner needle and is removed via an external concentric needle.

To consider the effect of damper width, the damper width is varied in a simple experimental system which mimics the basic functioning of fluid flow in fluid handling structure 12. FIG. 9 is a cross-sectional sketch of two versions of such a simple system, FIG. 9*a* and FIG. 9*b*. Each system has two concentric needles 90, 92. The inner needle 90 provides fluid, such as a liquid in the direction of an arrow 93. The outer needle 92 extracts fluid which may be a two phase fluid, as represented by an arrow 95. The two phase fluid may comprise the liquid supplied through the inner needle and the fluid radially outward of a meniscus 94, which may be a gas. In operation, there is continuous fluid refreshment. Both supply and extraction rates are variable and so are tunable. Use of two flow-controllers (not shown) allows a real-time monitoring. Shown in dotted lines are also represented the advancing side of the meniscus 94 and the receding side of the meniscus 96.

For ease of reference, the geometry indicated in FIG. 9*a* is referred to as a "needle" geometry. It has a minimal gas flow support for the meniscus. The radial outer undersurface 98 is in effect a damper 80, 82 with a small width. For ease of reference, the geometry indicated in FIG. 9*b* is referred to as a "cylinder" geometry. This geometry enables a strong gas flow from outside towards the extraction opening between the inner and outer concentric needles 90, 92. The radial outer undersurface 99 is in effect a damper 80, 82 with a large width. The width of damper 99 is larger than the damper 98 shown in FIG. 9*a*. In order to reduce or minimize fluid and/or surface contamination, standard ultra pure water may be employed. However, another immersion fluid may be used.

In the experimental system, a substrate W is clamped to a rotating substrate table. The experimental system can reach an effective scan speed of approximately 1.5 m/s with a maximum acceleration of 22 m/s$^2$. The substrate table may be imaged using a high speed camera having a high optical resolution (small pixel size). The camera may acquire images of the vertical cross section of an advancing meniscus and a receding meniscus of a droplet present between each of the needle and cylinder geometries of the experimental systems described with reference to FIGS. 9*a* and 9*b*. The set-up can have a high speed, high resolution camera capable of imaging a bottom view, showing the shape of the contact line of the meniscus on the substrate W.

Usually the critical speed is defined as the velocity for which the receding contact angle becomes zero. A receding contact angle of zero generally means the surface is continuously wetted. For lithographic purposes the definition has to be reconsidered, because control of the immersion liquid is lost before the contact angle reaches the zero value. In these experimental systems, the critical speed is defined as the velocity at which a droplet, such as a pearling droplet, is lost from the receding meniscus.

To determine the critical speed of each of the experimental systems, tests may be carried out using different photo resist coatings. The procedure follows. A substrate with a photo resist coating is secured to the rotating substrate table. The experimental system with either the needle or cylinder geometry is mounted at a specific height (e.g. needle height 97) above the surface of the substrate. The immersion liquid supply and gas extraction flow rates are set at predefined values. The substrate table is rotated, starting with a predefined acceleration. To avoid the influence of inertial effects a low acceleration value of 1 m/s$^2$ may be desirably used. Since most photo resist coatings are sensitive to the contact with immersion liquid, the contact time can be minimal. The complete test is desirably finished before the substrate table completes a rotation. The circumference of a 300 mm test substrate is approximately 1 m. So with an acceleration of 1 m/s$^2$, a maximum velocity greater than 1 m/s can be achieved within one turn. The achieved velocity can be above the critical speed for commonly available commercial resists used in immersion lithography.

After initiation of rotation, a trigger may start the camera. The frame rate can be 1000 fps, so that in each millisecond an image is acquired. Each image can show the advancing and receding meniscus in a vertical cross section. Images made from the bottom side require the use of a transparent substrate, which may be made of glass. Desirably, the photo resist is coated on the glass substrate with the same adhesion quality to avoid disturbances of the coating layer during testing. Each test may be repeated three times. This is to take into account variations in coating properties, i.e. the contact angle of the coating.

The aim of the testing is to investigate the effect of a gas flow on the receding meniscus during scanning. Two series of tests can be performed: one with the experimental system with the needle geometry and one with the experimental system with the cylinder geometry, as shown in FIGS. 9a and 9b. In both cases the supply needle is placed at the same height above the substrate surface. The extraction needle 92 in the needle geometry may be placed substantially higher than the outlet of the supply needle 90, so that there is a step in distance from the substrate surface W between the undersurfaces of the two needles 90, 92. The flow over the meniscus was, in this geometry, minimal. Extraction in this geometry may only extract the surplus immersion liquid from the sliding droplet.

Figure 10:
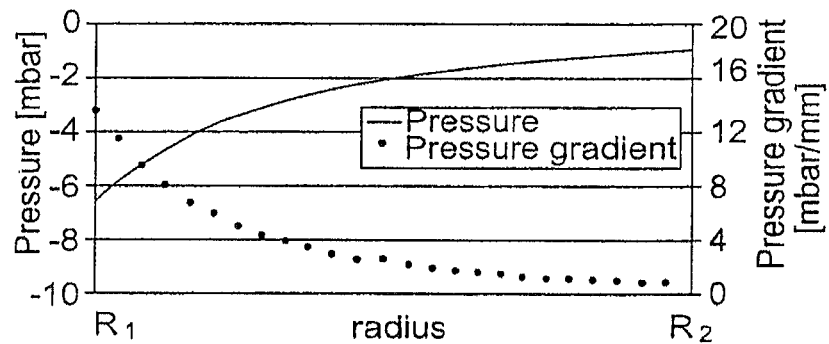
FIG. 10 is a graphical representation of a radial pressure profile and pressure gradient below a cylinder geometry of a concentric needle system in which the maximum pressure gradient is 13 mbar/mm at an extraction opening.

The extraction needle 92 of the cylinder geometry may be placed at the same level as the supply needle 90, so that the undersurfaces of the outer needle 92 and the inner needle 90 are co-planar. In this case there is a strong radially converging flow towards the extraction opening defined between the two needles 90, 92. In the cylinder geometry the gas flow is only a function of the radius and can be described with a simple one-dimensional compressible flow model (which is not disclosed in the present document). A result of this model for the cylinder geometry and the flow conditions during the experiment is shown in FIG. 10. FIG. 10 is a representation of the calculated pressure profile and pressure gradient for the cylindrical geometry. The profile is measured over the distance between the radial position of the extraction slit R1 and the radial position of the outer cylindrical boundary R2.

All testing may be performed on an immersion lithographic coating with a static contact angle of 78°.

Figure 12:
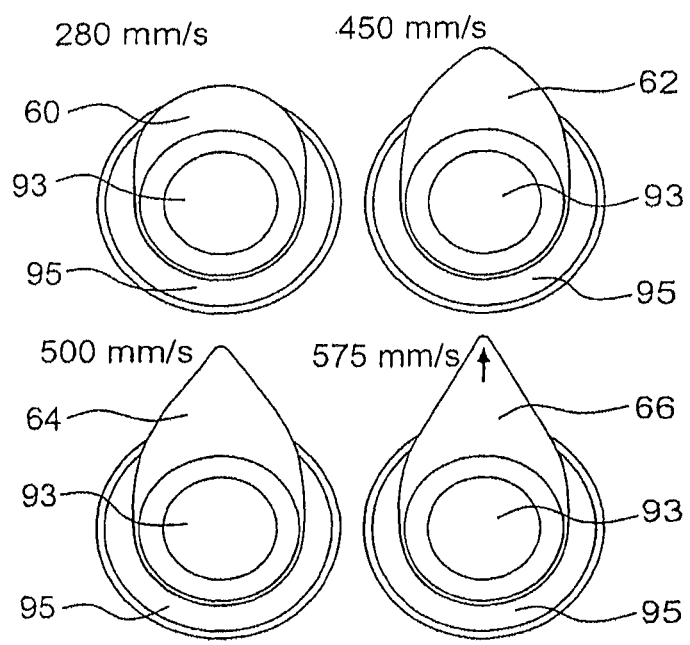
FIG. 12 are bottom views of a concentric needle system having the needle geometry at different substrate velocities showing receding tail development.

FIG. 12 shows a bottom view of a moving "droplet" below the supply needle of the needle geometry at different velocities. At a velocity of 280 mm/s the receding meniscus is still substantially circular. The receding meniscus has a receding contact line 60 which has just passed the edge of the extraction needle. This can be seen more clearly in a vertical cross section of the meniscus shown in FIG. 13. The dynamic contact angle (DCA) at a substrate velocity of 290 mm/s is approximately 49°. On increasing the velocity of the substrate further towards 450 mm/s, the circular contact line gradually transforms into a corner tail 62. At 500 mm/s the corner tail forms a triangularly shaped receding tail (or receding corner tail) 64. At 575 mm/s the receding tail 64 forms a top angle 66 of 60°. Similar to the analysis presented by Podgorski [Podgorski, T., Flesselles, J. M. and Limat L. (2001). Phys. Rev. Lett. 87, 036102, herein incorporated by reference], the normal velocity of the contact line (the contact line velocity $V_{CL}$) may be constant. However, increasing the substrate velocity (Vwafer) results in a decrease of the top angle, according to the formula:

$$topangle = 2\arcsin\left(\frac{V_{CL}}{V_{wafer}}\right) \quad (1)$$

Figure 11:
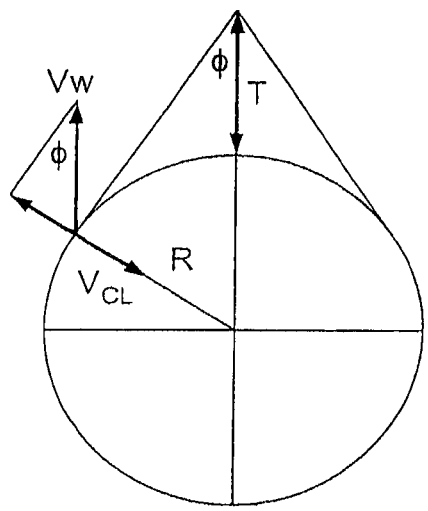
FIG. 11 is a schematic representation of a stable tail behind a sliding droplet with radius R and tail length T, showing the relationship between a substrate velocity Vwafer and a contact line velocity $V_{CL}$.

FIG. 11 shows goniometric relations in determining the shape of the tail, while the substrate is moving with velocity Vwafer (or $V_w$). The contact line velocity $V_{CL}$ of the angled contact line may balance the component of Vwafer perpendicular to the contact line. This may create a top angle according to equation (1). As long as these two velocities are in balance with each other, the position of the tail can be fixed with respect to the needle. This is referred to as a "stable" tail. The length of the tail T is related to the radius R of the circular contact line according to the formula:

$$T = R\left[\frac{V_{wafer}}{V_{CL}} - 1\right] \quad (2)$$

R = radius of the static meniscus

T = tail length

The contact line velocity could be determined simply by measuring the top angle in the pictures given at a specific substrate velocity. At a top angle 66 of 60° the tail can become instable and can start to generate a droplet which may be referred to as a pearling drop. This is also similar to the results presented by Podgorski about the stability of the tail of a running droplet under the action of gravity.

The velocity at which the tail starts generating a pearling drop is called the critical speed. The DCA at that speed is not zero, but approximately 10°. The derived contact line velocity was $V_{CL}$=290 mm/s.

Figure 14:
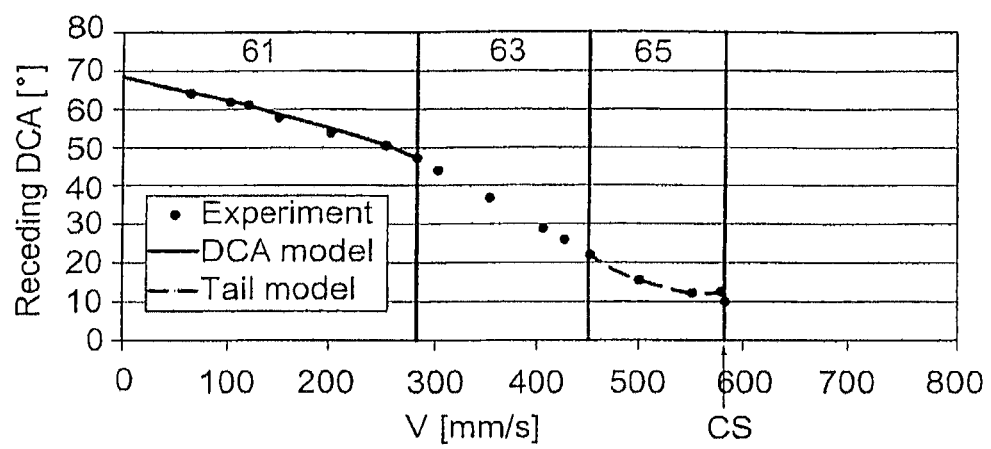
FIG. 14 graphically represents the receding dynamic contact angle as function of substrate velocity for a concentric needle system having the needle geometry.

In FIG. 14 the evolution of the dynamic contact angle is displayed as function of the substrate velocity. The graphical representation shows the dynamic receding contact angle (for an equivalent static contact angle (SCA) of 78°) for a needle geometry. There are three phases represented: a round tail 61, a transition 63 and a corner tail 65. The arrangement has a critical speed (CS) of 575 mm/s. Since at low velocities measurement may be unreliable, the first point is measured at a velocity of 60 mm/s. For a round tail 61 as well as the corner tail 65 it is possible to describe the DCA with a straightforward model. Consider first the DCA model for a round or circular tail. It was expected that the receding contact angle for the round shaped tail would obey the Hoffman-Voinov-Tanner law (HVT-law) [Hoffman, R. L. (1975). J. Colloid Inter. Sci., v 50, p 228; Voinov, O. V. (1976). Fluid. Dyn, v 11 p 714; and Tanner, L. H. (1979). J. Phys. D:Appl. Phys. v 12 p 1473—which are all hereby incorporated in their entireties by reference]:

$$\vartheta_s^3 - \vartheta_d^3 = ACa,$$

$$Ca = \frac{\mu V}{\gamma},$$

capillary number $\vartheta_s$ = the static receding contact angle $\vartheta_d$ = the dynamic receding contact angle $A$ = proportionality constant The solid line in FIG. 14 is a best fit through some experimental data using the HVT-law with the proportionality constant A=280. Podgorski reported a value A=250 for a running droplet. The results are in the same order of magnitude. However, the shape and the size of the tail of a needle droplet are different from the shape and tail of a running droplet. Extrapolation towards zero substrate velocity results in a static receding contact angle of 68°. This is 10° below the static contact angle of 78°.

Figure 13:
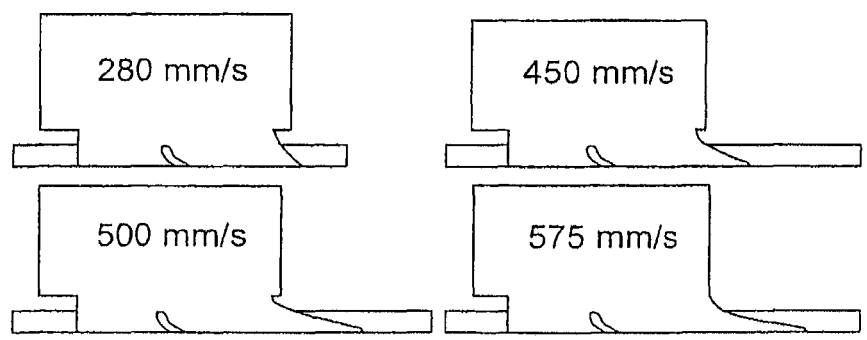
FIG. 13 shows side views of a concentric needle system having the needle geometry at the same velocities as shown in FIG. 12 showing change in the meniscus shape with scan velocity.

On formation of a corner tail a value for the DCA can be derived with a simple geometric relation. The profiles in FIG. 13 show that the tail (starting from the corner at the substrate surface) is straight over a long range. This means that the DCA can be calculated according to the following relations, herein referred to as the "tail model".

$$T = R\left[\frac{V_{wafer}}{V_{CL}} - 1\right]$$

$$DCA = \arctan\left(\frac{H}{T}\right) = \arctan\left(\frac{HV_{CL}}{R(V_{wafer} - V_{CL})}\right)$$

$R$ = Radius of the static meniscus $H$ = height of straight part of the tail $T$ = tail length The results of this model are plotted in FIG. 14 with a dashed line for a different part of the same data set as for that which was considered using the HVT-law. Height H may vary linearly with the substrate velocity.

Figure 15:
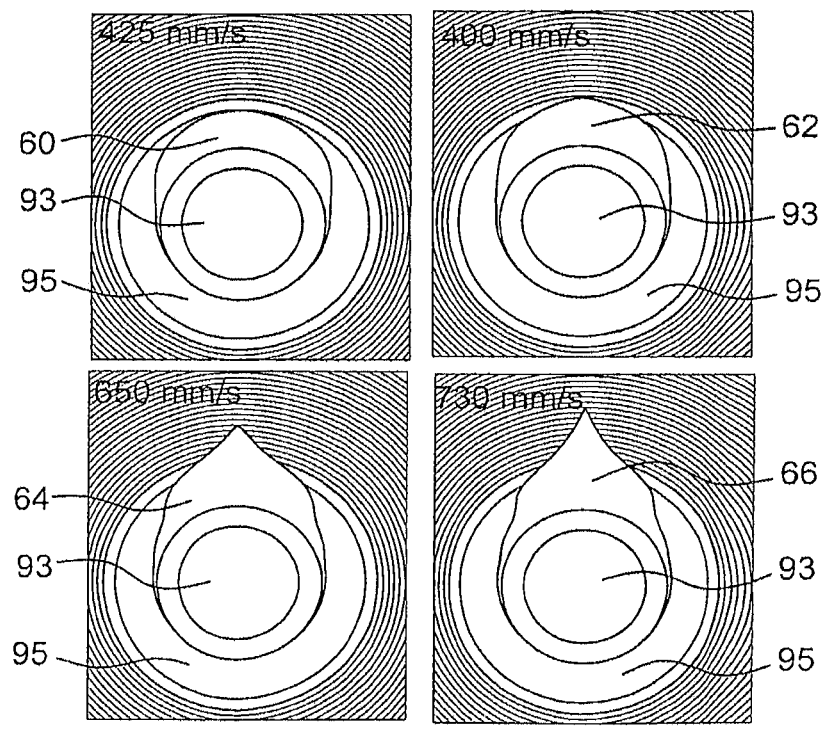
FIG. 15 are bottom views of a concentric needle system having the cylinder geometry at different substrate velocities showing receding tail development.

FIG. 15 shows a bottom view of a sliding droplet below the supply needle of the cylinder geometry at different velocities. The receding meniscus is still substantially circular at a velocity of 425 mm/s. The receding contact line 60 at this speed may reach the outer boundary of the extraction opening between the inner and outer needles 90, 92. The radial pressure gradient of 13 mbar/mm below the cylinder appears to have influenced the contact line velocity. In experimental data, the contact line velocity in this geometry is increased by 145 mm/s in comparison to the needle geometry, where the pressure gradient was of order 1.5 mbar/mm. At 500 mm/s the transition through a transition tail 62 to a corner tail 64 may be complete. The tail top angle 66 can develop according to equation (1) with a contact line velocity of $V_{CL}$=460 mm/s. This velocity is a higher velocity than the contact line velocity at the start of the transition. This could be caused by the more effective gas flow over the meniscus below the cylinder instead of in the extraction opening between the inner and outer needles 90, 92.

Figure 16:
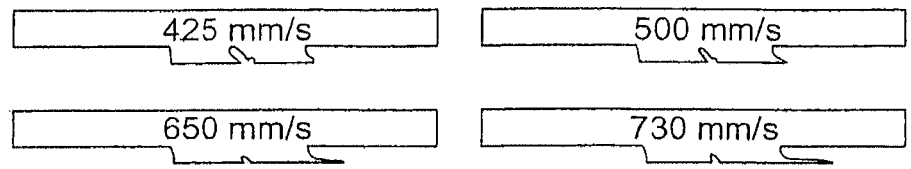
FIG. 16 shows side views of a concentric needle system having the cylinder geometry at the same velocities as shown in FIG. 15 showing change in the meniscus shape with scan velocity.

At a velocity of 600 mm/s, the DCA is reduced to approximately 10°. A further increase in the velocity results in a flat tail. A flat tail can be seen in the side view of a droplet in FIG. 16. Near the end of the tail the meniscus can bend towards the surface creating a new DCA at a small local scale. The resolution of the images shown in FIG. 16 is not small enough for a reasonable estimation of the local scale contact angle. Until the critical velocity is reached the tail may remain flat and at substantially a constant height. The height of the flat tail can be determined by a rather simple Poiseuille-Couette flow, without mass flow through each vertical cross section.

Based on the contact line velocity of 460 mm/s during the tail development, a critical velocity above 900 mm/s could be expected. However as can be seen in FIG. 15, the tail top angle is already below 60° at a substrate velocity of 730 mm/s. This is considered to be the critical speed for the corresponding arrangement of the experimental system. From this observation it may be concluded that the contact line velocity decreases rapidly, if the pressure gradient diminishes further away from the extraction slit.

Figure 17:
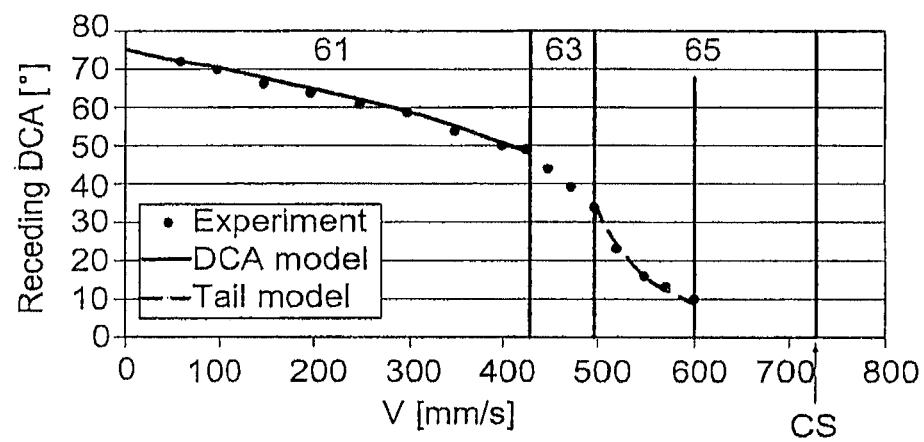
FIG. 17 graphically represents the receding dynamic contact angle as a function of substrate velocity for a concentric needle system having the cylinder geometry.

Fitting the HVT-law through the data points measured for the round tail, as shown in FIG. 17, a proportionality constant of A=280 was found, again. FIG. 17 illustrates the dynamic receding contact angle for the cylinder geometry. There are four regions: a round tail 61, transition 63 and a corner tail 65 which may be inclined and then flat. There may a critical speed CS of 730 mm/s. Extrapolation towards the static receding contact angle can indicate a significantly higher value, 75°, than for the needle geometry. It is close to the static contact angle (SCA) of 78°.

A droplet on a receding moving plate can develop in a similar way as a running droplet from an inclined plate, as mentioned in Podgorski, Other authors, e.g. Blake [Blake, T. D., Dobson, R. A., Ruschak, K. J. (2004), J. Colloid Inter. Sci., 279, p 198-205, which is hereby incorporated in its entirety by reference] and Eggers [Eggers, J. (2004), Phys. Rev. Lett. 93, number 9, which is hereby incorporated in its entirety by reference] report an effect of hydrodynamic forces on the behavior of contact lines, referred to as hydrodynamic assist. In the discussion above, it may be seen that a hydrodynamic force created by a high velocity gas flow can have a substantial effect on the contact line velocity of a receding meniscus:

1) The DCA model can show that the effect of the hydrodynamic force is mainly a reduction of the contact angle hysteresis.
2) In the data sets referred to, the start of the transition from round to a cornered tail started at a DCA of approximately 50°.
3) In the corner tail phase the contact line velocity may be constant in both experimental systems, 290 mm/s for the needle geometry and 460 mm/s for the cylinder geometry.
4) Applying the HVT-law in both cases results in a DCA for the moving tail contact line of 47° and 45° respectively.
5) The critical velocity can be increased from 575 mm/s to 730 mm/s due to the high velocity gas flow over the receding meniscus on a substrate with a static contact angle of 78°.

An embodiment of the present invention therefore seeks to implement the improved understanding of a damper 80, 82 in a fluid handling structure 12, such as shown in FIG. 8. However, the damper may be present in two different forms, as mentioned above: as a corner part 82 and as a side part 80.

The function of the corner part 82 may be replicated using a single needle (which represents the corner opening 57 positioned at a corner 52). As described above, a tail of immersion liquid may be observed coming from the corner opening, as schematically represented by FIG. 11. In FIG. 11, Vscan is the scan speed and Vcl is the contact line speed perpendicular to the immersion liquid contact line. Vcl may reach a certain maximum velocity before immersion liquid loss occurs for a surface having a certain contact angle. If Vscan continues to increase, the tail angle decreases until it reaches a minimum angle of approximately 70°. Immersion liquid loss may then occur.

Figure 18:
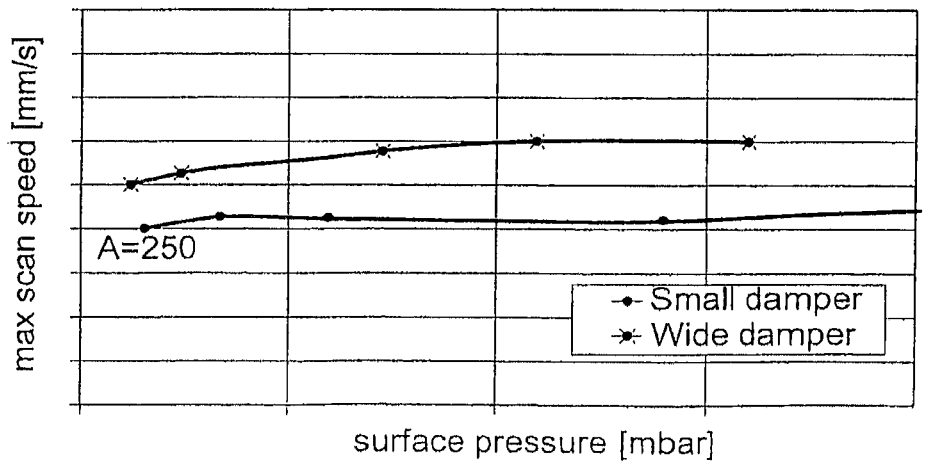
FIG. 18 is a graphical representation of experimental data demonstrating the scan speed gain which can be achieved using a lithographic apparatus according to an embodiment of the present invention.

As demonstrated in the experimental systems shown in FIGS. 9a and 9b, if the width of the damper is too small the meniscus may become unstable. The tail can become larger than an effective area of the damper. That is the length of the tail becomes longer than the width of the damper. There is no longer support for the tail and for the return flow of immersion liquid towards the extraction opening 50. The tail may become unstable. In this case the minimal top angle of 70° of the contact line may not be reached. The maximum Vscan is less than if the top angle of 70° could be reached. A scan speed gain for a wide damper as compared to a narrow damper is shown in the graph shown in FIG. 18. The static receding contact angle is in the range 60 to 70 degrees and is desirably about 65 degrees. The increase in scan velocity of the wide damper over the narrow damper can be as much as 50%.

For a constant radius of a corner part 82 of a damper, the relative width increases if the radius of a corner opening 57 increases. An immersion liquid containment performance gain can be detected. A larger corner radius decreases the wet footprint. A wet footprint of small size can be a limiting factor in the implementation of different solutions that increase the scan speed.

Normally, immersion liquid is lost between the openings 50 along the sides 54. However, substantially no immersion liquid is lost when the meniscus is positioned below the side part 80 of the damper. If a part of the meniscus moves radially outside the outer edge 84 of the damper, a droplet of immersion liquid may break away from the meniscus.

Figure 19:
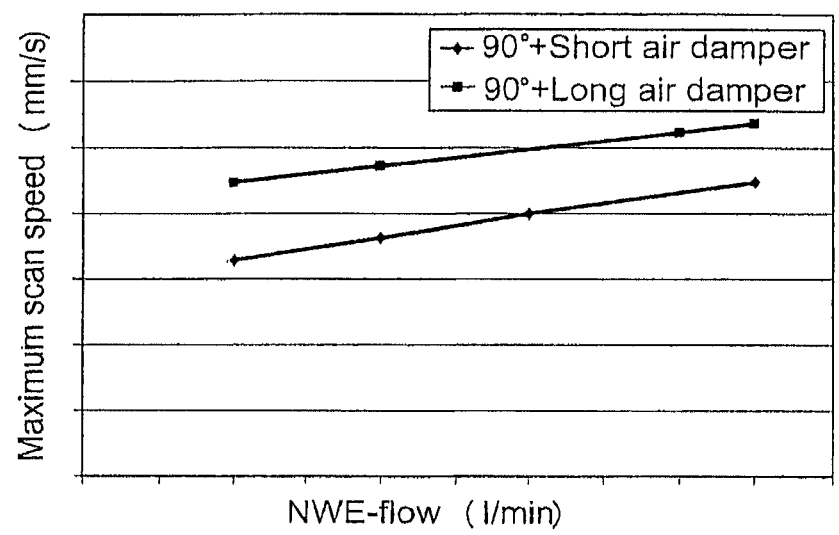
FIG. 19 is a graphical representation of experimental data showing scan speed gain which may be achieved by an implementation of the present invention.

By increasing the width of the of the side part of the damper by a factor of between two to sixteen, desirably by a factor of three to twelve, the meniscus can be pulled out further before the first immersion liquid is lost. So a higher scan speed can be achieved. In an embodiment, the width can be increased from 0.4 mm to 1.2 mm to 6 mm. The increase in performance is shown in the graph of FIG. 19. A flight height of between 50 μm to 200 mm may be used. The increase in scan speed may be by a factor of between five to fifteen percent.

In an embodiment, the width of the side part 80 of is uniform along its length. The width of such a damper 80 may be considered constant. Therefore the maximum achievable scan speed without droplet loss may be increased for a fluid handling system 40 relative to a facing surface, such as a substrate W, by increasing the width of the damper 80. The same can be the for a corner part 82 of the damper. The width of one or more of the corner parts 82 and/or one or more of the side parts 80 of the damper of a fluid handling structure 40 may be increased.

In an embodiment, a damper (one or more of the corner parts, one or more of the side parts, or both) may have a large width. The damper may desirably have a width at least as large as 0.3 mm, desirably at least as large as 0.5 mm or at least as large as 3 mm. Such a dimension may equate to the dimension, such as the width, of a target portion. In an embodiment, the upper limit is 10 mm, desirably 6 mm.

Note the arrangements shown in FIGS. 6 and 8. In FIG. 6 the openings 50 define a curved line. In FIG. 8 the side parts 82 of the damper are essentially straight. The comments of the previous paragraph relating to uniformity of width between a point between the edge 54 of the shape defined by the openings 50 and the outer edge 84 is thus independent of the path of either edge 54 and 84. However, in these embodiments, the edges have a similar path and so define similar shapes in and of the undersurface 51.

The forces applied to a fluid handling structure with a widened damper increase. Although a wider damper may enable a faster relative velocity (e.g. scan speed) between the undersurface of the fluid handling structure 40 and the facing surface, it may be desirable to limit the width of the damper at parts of the damper where the maximum width of the damper is not required to help ensure that a droplet is not lost. Such a location on the damper may be, for example, where droplet loss is unlikely to occur or even will not occur at the highest relative velocity (e.g. scan speed) used.

Figure 20:
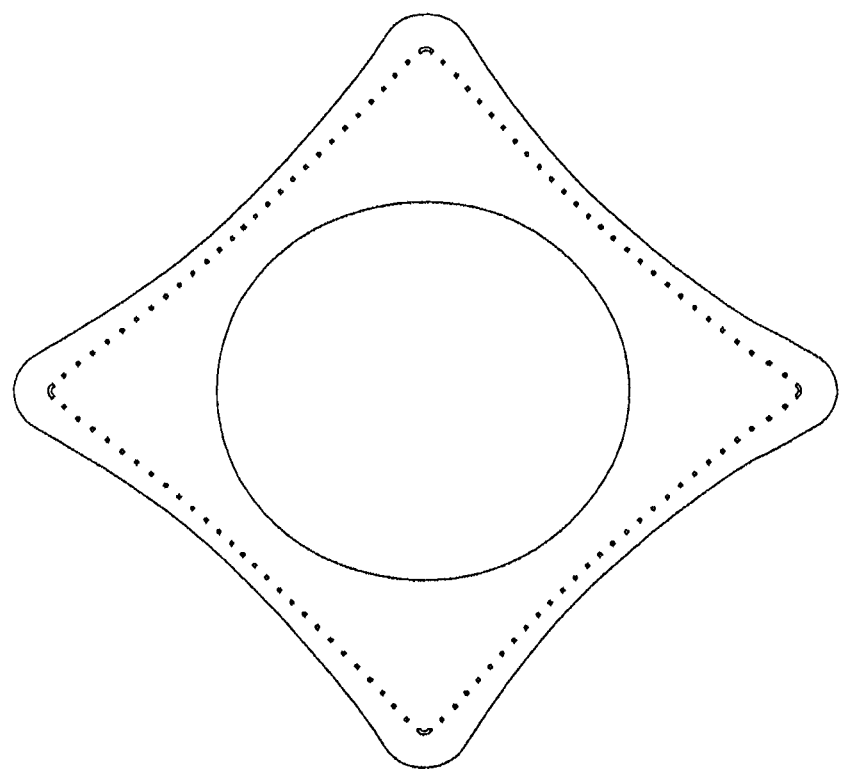
FIG. 20 illustrates, in plan, a practical embodiment of a fluid handling structure according to an embodiment of the present invention.
Figure 21:
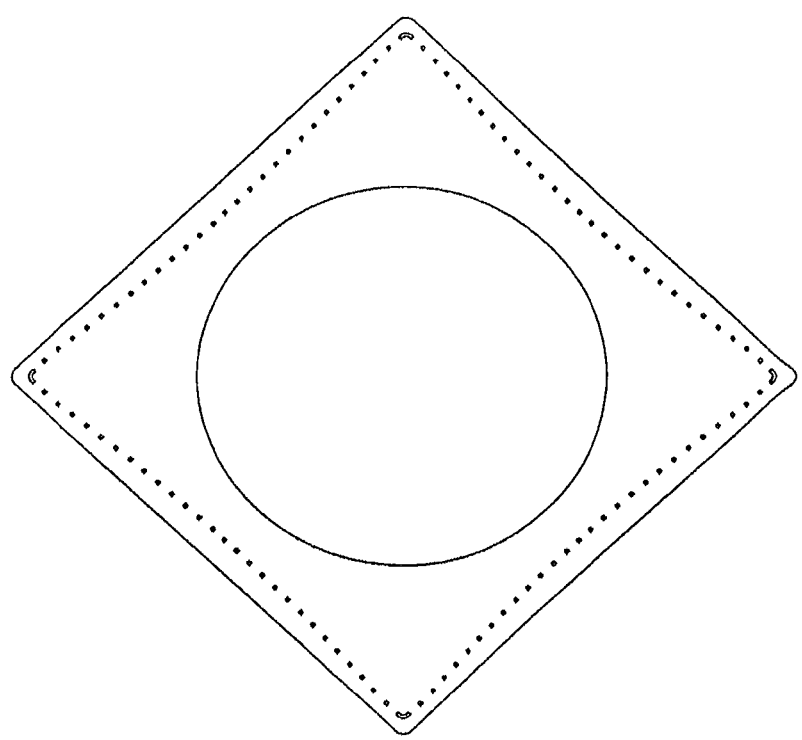
FIG. 21 illustrates, in plan, a practical embodiment of a fluid handling structure according to an embodiment of the present invention.

FIGS. 20 and 21 show different embodiments of a damper according to an embodiment of the present invention. Similar features have the same reference numerals to the features present in FIG. 8. In these embodiments, the edge 54 and the outer edge 84 define different paths and shapes. The damper width varies with position along the damper. The width of the damper may be selectively varied so that it is widest at locations at greatest risk of droplet loss. Thus droplet loss may be reduced if not prevented.

FIG. 20 shows a damper with greater width at the corner parts 82 than the side parts 80. The cornered shape formed by the openings 50 has edges 54 with a negative radius of curvature, for example relative to a center of the shape. The outer edge 84 of the side part 80 of the damper has a negative radius of curvature. The radius of curvature of the outer edge 84 associated with the side part 80 of the damper is smaller than the associated edge 54 of the shape. This means the width of the side part 80 of the damper is smaller away from a corner part 82 than closer to the corner part 82, e.g. towards a point, such as a midpoint, between two corner parts 82 of the damper than towards one of the adjoining corner parts 82 of the damper. The corner parts 82 of the damper may each have a positive radius of curvature. Thus, a corner part 82 of the damper has greater width than at a side part 80 of the damper. A side part 80 may have a width that decreases with displacement away from an adjoining corner part. In an arrangement as shown in FIG. 20 the parts of the damper towards and at the corner parts 82 have the largest width. Such an arrangement may be desirable for a fluid handling structure in which there is greatest risk of losing droplets from a corner.

FIG. 21 shows a damper with greater width at each of the side parts 80 of the damper than at each of the corner parts 82 of the damper. The cornered shape formed by the openings 50 has edges 54 with a negative radius of curvature, for example relative to a center of the shape. The outer edge 84 of the side part 80 of the damper has substantially zero radius of curvature, that is each edge is substantially straight. This means the width of the side part 80 of the damper is larger towards a point, such as a midpoint, between two corner parts 82 of the damper than towards one of the adjoining corner parts 82 of the damper. The width of the side part 80 of the damper may widen with displacement away from an adjoining corner part 82. The outer edge 84 has greater radius of curvature than the associated edge 54.

A corner edge 86 of a corner part 82 of the damper may have a positive radius of curvature. Each corner opening 57 may have a positive radius of curvature. The radius of curvature of the corner opening 57 may be the same or greater than the radius of curvature of the associated corner edge 86.

In an arrangement as shown in FIG. 21 the parts of the damper away from the corner parts 82, e.g. towards the midpoints of the side part 80, have the largest width. Such an arrangement may be desirable for a fluid handling structure in which there is greatest risk of losing droplets from a side part, such as at its midpoint.

In an embodiment, for example as shown in FIG. 21, the damper at a corner part 82 has greater width than at an edge part 80, especially towards a point, such as the midpoint, between two corner parts 82. However, under some circumstances, the corner part may be wider than widest part of the side part 80. This can occur when the radius of curvature of the corner opening 57 is much greater than the corner edge 86. The difference in the radius of curvature between the shape edge 54 and the outer edge 84 may be small. The difference in radial curvature between a corner opening 57 and a corner edge 86 may be seen in FIG. 8, where each corner opening 57 has a radius of curvature at least the same as that of the associated corner edge 86.

As shown in FIGS. 8, 20 and 21, the damper width can vary around the periphery of the shape of formed by the openings. It is desirable under some circumstance to have certain parts of the damper 80, 82 have a larger dimension, e.g. width, than others, for example to achieve a greater critical scan speed may be without droplet loss.

An optimized damper shape may have a width that varies along the length of a side part 80 of the damper. A larger damper is desirable near the advancing and trailing features of the fluid handling structure 12 moving relatively to a substrate W, substrate table WT or both. The width in the corner parts 82 of the damper can be equal or larger than the width towards the midpoint of the side part 80. That is the damper 80, 82 near the corners 52 of the cornered shape formed by the openings 50 would be at least as wide as the damper along the edge 54 at its widest part. The damper width variation may be the same for all corners, widths or both to obtain equal critical scan speeds for the −x, +x, −y and +y direction. In an embodiment the damper has four corner parts 82 and four side parts 80.

The width of the damper can be optimized for a specific cornered shape. It is not necessary to have a constant gas damper length all around the shape for the same maximum scan speed. It can be desirable for forces applied to the meniscus to have a narrow damper at certain locations on the damper side 80 or corner 82, especially if the maximum achievable scan speed with a stable meniscus is not affected.

It should be noted that the width of the side part 80 and/or corner part 82 of the damper is separate from, e.g. independent of, the specific cornered shape defined by the openings 50. However, the damper 80, 82 width is desirably defined as the distance between the outer edge 84, 86 and the nearest part of the cornered shape defined by the openings 50. Thus the damper in a fluid handling structure is defined as the variation of the width of the damper 80, 82 along the outer edge 84, 86.

At the corner part 82 of the damper, variations in the damper width along the corner edge 86 may be additionally or alternatively defined by the relative radius of curvatures of the corner opening 57 and of the associated corner edge 86. For a specific damper width at the point where a corner part 82 adjoins a side part 80, the greater the radius of curvature of the corner opening 57 relative to that of the corner edge 86, the larger the width of the corner part 82 of the damper relative to the width of the side part 80 at the point where it adjoins the corner part 82. So the corner part 82 widens with displacement away from an adjoining side part. If the radius of curvature of the corner opening 57 is smaller than the radius of curvature of the corner edge 86, the corner part 82 width narrows e.g towards the midpoint of the corner edge 86.

It may be desirable for the point of the damper corner edge 86, which may be at its midpoint, e.g. apex, to be sharper than the corresponding corner opening 57 (that is to have a smaller radius of curvature than the corner opening 57). Such a sharp corner point of the edge 86 can increase the area of the corner part 82 of the damper compared to a blunt point. A receding contact line, i.e. a tail of immersion liquid, would be beneath the damper with a sharp point at higher scanning speeds than for a damper with a blunter point.

Variations in the damper width along the side part 80 may be additionally or alternatively determined by the relative radius of curvatures of the edge 54 of the cornered shape and the associated outer edge 84. The variation in width may be considered at the point where a corner part 82 adjoins a side part 80. The greater the difference in radii of curvatures between the shape edge 54 and the outer edge 84, the wider the damper becomes towards the midpoint of the side part 80 of the damper. So with increased displacement from a corner part 82, the wider the side part 80 of the damper. However the shape edge 54 may have a negative radius of curvature and the outer edge 84 may have a positive, negative or a zero radius of curvature. So in some embodiments, the difference in radii may be negative. In this case, the damper width narrows.

The damper 80, 82, e.g. the damper surface, is desirably parallel to the substrate surface. In an embodiment the damper is an undersurface 51 of the fluid handling system 12. The undersurface 51 may be parallel to the substrate surface. The damper 80, 82, e.g. the damper surface, may be angled relative to the undersurface 51. For example, the damper surface may be angled to have an increasing distance above the openings 50 in a radially outward direction. The angle of damper surface relative to the undersurface may be between 0 and 15 degrees, desirably between 0 and 10 degrees or even 0 to 5 degrees.

The embodiments described above refer to a fluid handling structure which may be used to confine immersion liquid to a space between a projection system and a facing surface such as a substrate or a substrate table. Another type of fluid handling system in which an embodiment of the invention may be implemented is a dryer for a drying station. In such a fluid handling structure, the liquid is removed from the facing surface.

In an embodiment a dryer may be used in an all-wet type immersion system in which the entire surface of the substrate and optionally a part of the surrounding substrate table is covered in a thin film of immersion liquid. The dryer is used to remove the liquid from the substrate table either with the substrate present on the substrate table before it is removed or after it is removed. Another application is to remove liquid from a sensor or a target for use with a sensor, such as a sensor used in imaging or optical control systems. Such a sensor could be a transmission image sensor (commonly referred to as a TIS). A target could be a grid plate for use with an encoder. The grid plate may extend along the edge of the substrate table WT. The sensor, target, or both, may be located on a table, such as a substrate table, and may be at risk of contacting immersion liquid, at least as a droplet. Application of the dryer would remove the liquid from the surface of the sensor, target or both. See U.S. provisional patent application No. 61/193,721, filed on 18 Dec. 2008, which is hereby incorporated by reference in its entirety.

Figure 22:
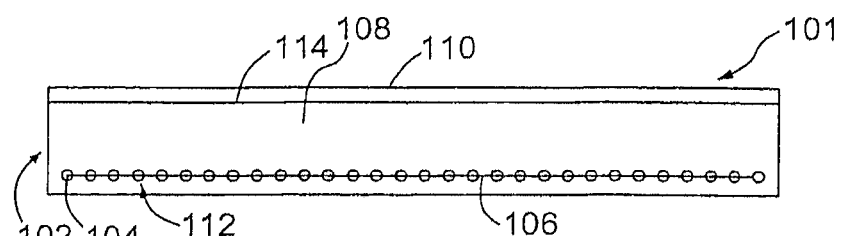
FIG. 22 illustrates, in plan, an embodiment of a fluid handling structure according to an embodiment of the present invention

An underneath plan view of such a fluid handling structure 101 is shown in FIG. 22. In an undersurface 102 of the fluid handling structure 101 are defined openings 104. The openings 104 operate in the same way as the openings 50 mentioned above. The openings 50 define a line, which defines a line edge 106 of a damper 108. The undersurface 102 has a trailing outer edge 110 and an advancing outer edge 112. The advancing outer edge 112 in use is in contact with the immersion liquid of a wetted facing surface, e.g. a substrate, a table such as a substrate table, or both. Between the trailing outer edge 110 and the line edge 106 is an opening 114 for a gas knife. The edge 106 in use defines the approximate position of a meniscus of the immersion liquid. The width of the damper 108 is defined by the distance between the opening 114 for the gas knife and the line edge 106.

In use, as the liquid handling structure 101 is moved over the wetted surface, and/or the wetted surface is moved under the liquid handling structure 101, the immersion liquid is removed from the surface through the openings 104 leaving a dry surface. Operation of the gas knife by a flow of gas through the opening 114 assists by reducing the amount of liquid, if not preventing liquid, on the facing surface passing the gas knife. The gas knife flow may direct liquid back towards the openings 104 so that the liquid is extracted. The width of the damper 108 assists the function of the effectiveness of the drying process in the same way as the damper of the fluid handling structure 40 mentioned previously. With a broader damper 108, a faster relative velocity between the undersurface 102 and the facing surface may be achieved, enabling the surface to be dried quicker. Throughput may be increased.

Figure 23:
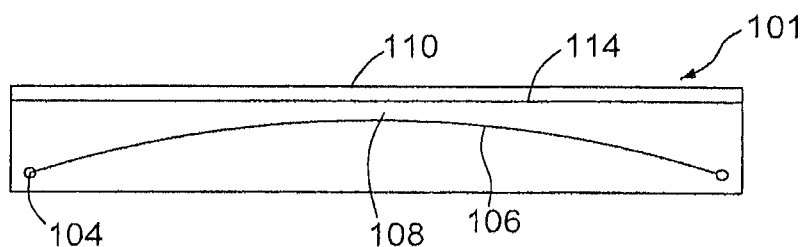
FIG. 23 illustrates, in plan, an embodiment of a fluid handling structure according to an embodiment of the present invention.
Figure 24:
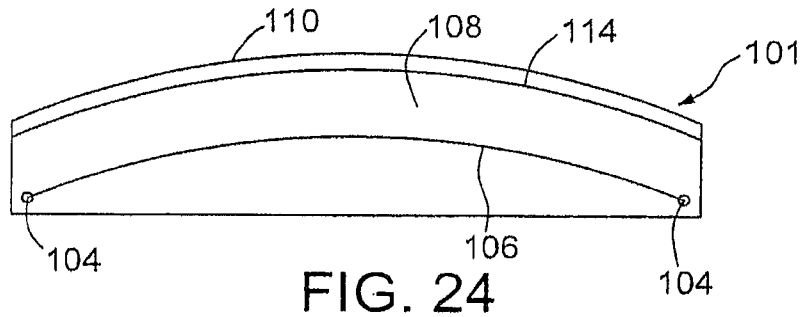
FIG. 24 illustrates, in plan, an embodiment of a fluid handling structure according to an embodiment of the present invention
Figure 25:
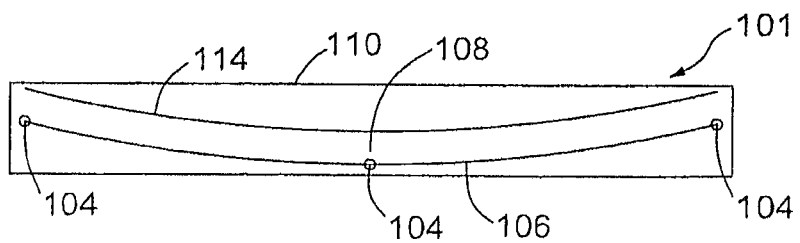
FIG. 25 illustrates, in plan, an embodiment of a fluid handling structure according to an embodiment of the present invention.

The embodiment shown in FIG. 22 shows an arrangement in which the width of the damper is uniform and the damper 108 is substantially straight. The gas knife opening 114 and the line edge 106 are substantially straight. Different arrangements may exist. In FIGS. 23-25, similar features are referred to by the same reference numbers. However, the individual openings 104 may be omitted for clarity and represented merely by a line edge 106.

FIG. 23 shows an arrangement which has a damper 108 which is wider at its ends than an intermediate point, such as its mid point. The trailing outer edge 110 is substantially straight, but the line edge 106 is curved.

FIG. 24 shows a variation of the embodiment shown in FIG. 23 in which the trailing outer edge 110 is curved, having a larger radius of curvature than the line edge 106.

In an embodiment shown in FIG. 25 the trailing outer edge 110 may be the same as that shown in FIG. 23 or FIG. 24, but the line edge 106 is curved with a relatively negative radius of curvature.

In any of FIGS. 22-25, the opening 114 may be: curved to have a similar shape as the line edge 106 as shown in FIGS. 24 and 25; substantially straight and parallel to the trailing outer edge 110 as shown in FIGS. 22 and 23; or positioned at an intermediate position and may have an intermediate configuration.

Figure 26:
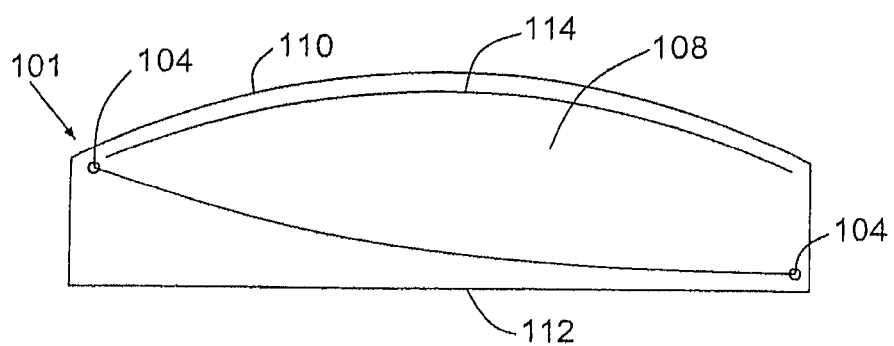
FIG. 26 illustrates, in plan, an embodiment of a fluid handling structure according to an embodiment of the present invention.
Figure 27:
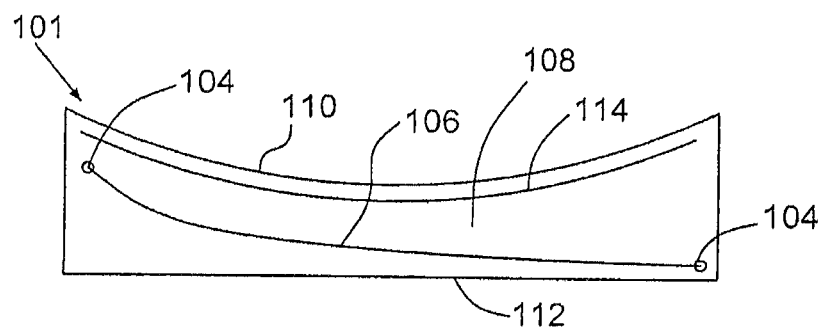
FIG. 27 illustrates, in plan, an embodiment of a fluid handling structure according to an embodiment of the present invention.

FIGS. 26 and 27 show embodiments in which the trailing outer edge 110 has a positive and negative radius of curvature, respectively. In the embodiments shown the opening 114 is defined to have a similar shape to the trailing outer edge 110, but in other embodiments, the trailing outer edge 110 may have a different shape, for example it may be substantially parallel to the advancing outer edge 112 or have a similar shape to the line edge 106. The opening 114 is shown in FIGS. 26 and 27 close to the trailing outer edge 110, but in different embodiments the opening 114 may be located at a position closer to the line edge 106. In both the embodiments shown in FIGS. 26 and 27 the line edge 106 is angled with respect to the advancing outer edge 112, the trailing outer edge 110, or both. In FIG. 26 the line edge 106 is substantially straight; in FIG. 27 the line edge 106 is curved, for example with a negative radius of curvature.

Embodiments may exist which are any combination of the different features mentioned with reference to FIGS. 22 to 27.

In these embodiments, the width of the damper 108 may be largest (in the direction of movement of the dryer 101 relative to the facing surface, so this could be the width of the damper 108) where droplet loss may be most likely to occur. This may be towards one or both of the ends of the undersurface 102, the middle, or another location. For example the portion of the damper under which a target or a sensor, such as a TIS, passes.

Any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment there is provided a fluid handling structure for a lithographic apparatus. The fluid handling structure has a plurality of openings arranged, in plan, in a line. The fluid handling structure is configured such that the openings are directed, in use, towards a facing surface, the facing surface being a substrate and/or a substrate table configured to support the substrate. Outward of the line of openings is a damper. The damper has a width that varies along the line of openings. The width is defined between the line of openings and an opposing damper edge.

The line may have a radius of curvature different from the damper edge. The line may form a cornered shape. The damper may have a corner part associated with each corner and a side part between each corner part. At a corner of the cornered shape, one of the openings may be a curved corner opening. The curved corner opening may be at the apex of the corner. The corner opening may have a radius of curvature different from the radius of curvature of the opposing damper edge. The radius of curvature of the corner opening may be at least the same as or greater than the radius of curvature of the opposing damper edge.

The damper width may be larger at a corner part than at a side part. The dimensions of each corner part may be substantially the same, the dimension of each side part may be substantially the same, or both.

The openings may be inlets for the passage of gas and/or liquid into the fluid handling structure. The openings may surround a space to which the fluid handling structure is arranged to supply fluid. The openings may be formed in plan around the periphery of the space.

The line defined by the openings may be continuous and may have a continuously changing direction. The damper may be radially outward of the line of openings. The fluid handling structure may be configured to supply liquid to a localized portion of the facing surface and to confine the liquid to the localized portion.

The fluid handling structure may be a dryer configured to remove liquid from the facing surface.

A lithographic apparatus may comprise the fluid handling structure. The lithographic apparatus may comprise a projection system configured to project a patterned beam of radiation onto a target portion of a substrate and a substrate table configured to support the substrate.

In use, a corner of the cornered shape may points in a scanning or in a stepping direction. The lithographic apparatus may comprise a projection system configured to project a patterned beam of radiation onto a target portion of a substrate and a substrate table configured to support the substrate. The fluid handling structure may be configured to supply liquid to a space defined between: the substrate, the substrate table, or both, the projection system, and the fluid handling structure. The fluid handling structure may be constructed and arranged to at least partly confine the liquid to the space.

In an embodiment there is provided a fluid handling structure for a lithographic apparatus. The fluid handling structure has a plurality of openings arranged in plan, in a line. The fluid handling structure is configured such that the openings are formed in an undersurface of the fluid handling structure and are directed, in use, towards a facing surface. The facing surface is the surface of a substrate and/or a substrate table configured to support the substrate. Outward of the line is a damper. The damper has a surface that is angled relative to the undersurface.

In an embodiment there is provided a fluid handling structure for a lithographic apparatus. The fluid handling structure has a plurality of openings arranged in plan, in a line. The fluid handling structure is configured such that the openings are directed, in use, towards a facing surface. The facing surface is a surface of a substrate and/or a substrate table configured to support the substrate. Outward of the line of openings is a damper. The damper has a width defined between the line of openings and an opposing damper edge. The width is at least 0.3 mm. The width may be no more than 10 mm. The width may be uniform.

In an embodiment there is provided a device manufacturing method, comprising: providing a fluid to a surface of a substrate and/or substrate table, the substrate table supporting the substrate; and retrieving liquid from between the surface of the substrate and/or the substrate table by applying an under pressure to a plurality of openings in a fluid handling structure, the openings being arranged, in plan, in a line and being directed towards a substrate and/or a substrate table. In retrieving the liquid a contact line of the liquid is supported by a damper, the damper being positioned radially outward of the line of openings and having a width that varies along the line of openings, the width being defined between the line of openings and an opposing damper edge.

In providing the fluid the providing may be between a projection system and the surface and in retrieving the liquid, the retrieving may be from between the projection system and the surface.

The descriptions above are intended to be illustrative, not limiting. Thus, it will be apparent to one skilled in the art that modifications may be made to the invention as described without departing from the scope of the claims set out below.

The invention claimed is:

1. A fluid handling structure system for a lithographic apparatus, the fluid handling structure system comprising:
a first fluid handling structure having a first body having a plurality of openings, the first fluid handling structure configured such that the openings are directed, in use, towards a facing surface, the facing surface being a substrate and/or a substrate table configured to support the substrate, the first fluid handling structure configured to supply liquid to a localized portion of the facing surface and to confine the liquid to the localized portion, and the openings are configured to extract liquid; and
a second fluid handling structure having a second body physically separate from the first body of the first fluid handling structure when in the lithographic apparatus with the first fluid handling structure, the second body having one or more apertures directed, in use, towards the facing surface, the one or more apertures arranged in a curved layout in a plane parallel to the facing surface, and the second fluid handling structure is configured to extract liquid.

2. The fluid handling structure system of claim 1, wherein the one or more apertures are for the passage of gas and/or liquid into the second fluid handling structure.

3. The fluid handling structure system of claim 1, wherein the second fluid handling structure is a dryer configured to remove liquid from the facing surface.

4. A lithographic apparatus comprising a projection system configured to project a beam of radiation onto a radiation-sensitive substrate and the fluid handling structure system of claim 1.

5. The fluid handling structure system of claim 1, wherein the second fluid handling structure further comprises one or more further apertures, the further apertures configured to pass a fluid out of the second fluid handling structure onto the facing surface, the one or more further apertures arranged in a curved layout in a plane parallel to the facing surface.

6. The fluid handling structure system of claim 1, wherein the second fluid handling structure comprises an outer edge at least partially curved in a plane parallel to the facing surface.

7. The fluid handling structure system of claim 1, wherein the one or more apertures comprises an elongate, curved aperture.

8. A fluid handling structure system for a lithographic apparatus, the fluid handling structure system comprising:
a first fluid handling structure having a first body having a plurality of openings, the first fluid handling structure configured such that the openings are directed, in use, towards a facing surface, the facing surface being a substrate and/or a substrate table configured to support the substrate, the first fluid handling structure configured to supply liquid to a localized portion of the facing surface and to confine the liquid to the localized portion, and the openings are configured to extract liquid; and
a second fluid handling structure having a second body physically separate from the first body of the first fluid handling structure when in the lithographic apparatus with the first fluid handling structure, the second body having one or more apertures directed, in use, towards the facing surface and having an outer edge at least partially curved in a plane parallel to the facing surface, and the second fluid handling structure is configured to extract liquid.

9. The fluid handling structure system of claim 8, wherein the second fluid handling structure further comprises one or more openings configured to pass a fluid out of the second fluid handling structure onto the facing surface, the one or more opening of the second fluid handling structure arranged in a curved layout in a plane parallel to the facing surface.

10. The fluid handling structure system of claim 9, wherein the one or more apertures are arranged in a curved layout in a plane parallel to the facing surface.

11. The fluid handling structure system of claim 8, wherein the one or more apertures comprises an elongate, curved aperture.

12. The fluid handling structure system of claim 8, wherein the one or more apertures comprises a plurality of apertures arranged in a substantially straight line.

13. The fluid handling structure system of claim 8, wherein the second fluid handling structure is a dryer configured to remove liquid from the facing surface.

14. A lithographic apparatus comprising a projection system configured to project a beam of radiation onto a radiation-sensitive substrate and the fluid handling structure system of claim 8.

15. A fluid handling structure system for a lithographic apparatus, the fluid handling structure system comprising:
a first fluid handling structure having a first body having a plurality of openings, the fluid handling structure configured such that the openings are directed, in use, towards a facing surface, the facing surface being a substrate and/or a substrate table configured to support the substrate and the openings are configured to extract liquid; and
a second fluid handling structure having a second body physically separate from the first body of the first fluid handling structure when in the lithographic apparatus with the first fluid handling structure, the second body of the second fluid handling structure having one or more first apertures directed, in use, towards the facing surface and configured to exhaust a fluid and having one or more second apertures directed, in use, towards the facing surface and configured to supply a fluid.

16. The fluid handling structure system of claim 15, wherein the one or more first apertures are arranged in a curved layout in a plane parallel to the facing surface.

17. The fluid handling structure system of claim 15, wherein the one or more second apertures are arranged in a curved layout in a plane parallel to the facing surface.

18. The fluid handling structure system of claim 15, wherein the second fluid handling structure comprises an outer edge at least partially curved in a plane parallel to the facing surface.

19. The fluid handling structure system of claim 15, wherein the second fluid handling structure is a dryer configured to remove liquid from the facing surface.

20. A lithographic apparatus comprising a projection system configured to project a beam of radiation onto a radiation-sensitive substrate and the fluid handling structure system of claim 15.

\* \* \* \* \*